(12) United States Patent
Xie et al.

(10) Patent No.: US 8,492,170 B2
(45) Date of Patent: Jul. 23, 2013

(54) UV ASSISTED SILYLATION FOR RECOVERY AND PORE SEALING OF DAMAGED LOW K FILMS

(75) Inventors: Bo Xie, Santa Clara, CA (US); Alexandros T. Demos, Fremont, CA (US); Kang Sub Yim, Palo Alto, CA (US); Thomas Nowak, Cupertino, CA (US); Kelvin Chan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 103 days.

(21) Appl. No.: 13/093,351

(22) Filed: Apr. 25, 2011

(65) Prior Publication Data
US 2012/0270339 A1 Oct. 25, 2012

(51) Int. Cl.
*H01L 21/30* (2006.01)
(52) U.S. Cl.
USPC ............................ 438/4; 438/597; 438/795
(58) Field of Classification Search
USPC ................... 438/4, 795; 257/E21.211
See application file for complete search history.

(56) References Cited

U.S. PATENT DOCUMENTS

| | | | |
|---|---|---|---|
| 6,451,512 B1 | 9/2002 | Rangarajan et al. | |
| 6,962,869 B1 | 11/2005 | Bao et al. | |
| 7,098,149 B2 | 8/2006 | Lukas et al. | |
| 7,468,290 B2 | 12/2008 | Lukas et al. | |
| 7,541,200 B1 | 6/2009 | van Schravendijk et al. | |
| 7,741,224 B2 | 6/2010 | Jiang et al. | |
| 7,750,479 B2 | 7/2010 | Purushothaman et al. | |
| 7,851,232 B2 | 12/2010 | van Schravendijk et al. | |
| 7,892,985 B1 | 2/2011 | Cho et al. | |
| 7,932,188 B2 | 4/2011 | Lukas et al. | |
| 2005/0250346 A1 | 11/2005 | Schmitt | |
| 2006/0286774 A1* | 12/2006 | Singh et al. | 438/478 |
| 2007/0228570 A1* | 10/2007 | Dimitrakopoulos et al. | 257/754 |
| 2008/0042283 A1* | 2/2008 | Purushothaman et al. | 257/754 |
| 2008/0166870 A1* | 7/2008 | Huang et al. | 438/619 |
| 2008/0265381 A1 | 10/2008 | Afzali-Ardakani et al. | |
| 2008/0311728 A1 | 12/2008 | Asako et al. | |
| 2009/0170314 A1* | 7/2009 | Morinaga et al. | 438/672 |
| 2010/0233829 A1 | 9/2010 | McAndrew et al. | |
| 2010/0267231 A1 | 10/2010 | van Schravendijk et al. | |
| 2011/0117678 A1* | 5/2011 | Varadarajan et al. | 438/4 |

FOREIGN PATENT DOCUMENTS

| | | |
|---|---|---|
| KR | 10-2007-0019748 | 2/2007 |
| WO | WO-2011-017333 A3 | 2/2011 |

OTHER PUBLICATIONS

Hualiang Shi et al, "Dielectric Recovery of Plasma Damaged Organosilicate Low-k Films," http://www.me.utexas.edu/~ho/papers/2008_MRS_INTEL.pdf, 6 pages.
IMEC, Scientific Report 2007, http://www.imec.be/ScientificReport/SR2007/html/1384069.html, 13 pages.
International Search Report and Written Opinion dated Oct. 19, 2012 for International Application No. PCT/US2012/032203.

* cited by examiner

*Primary Examiner* — Angel Roman
(74) *Attorney, Agent, or Firm* — Patterson & Sheridan, LLP

(57) ABSTRACT

Methods for the repair of damaged low k films are provided. Damage to the low k films occurs during processing of the film such as during etching, ashing, and planarization. The processing of the low k film causes water to store in the pores of the film and further causes hydrophilic compounds to form in the low k film structure. Repair processes incorporating ultraviolet (UV) radiation and silylation compounds remove the water from the pores and further remove the hydrophilic compounds from the low k film structure.

20 Claims, 2 Drawing Sheets

UV ASSISTED SILYLATION FOR RECOVERY AND PORE SEALING OF DAMAGED LOW K FILMS

BACKGROUND OF THE INVENTION

1. Field of the Invention

Embodiments of the present invention generally relate to methods for repairing and lowering the dielectric constant of low k films for semiconductor fabrication.

2. Description of the Related Art

The dielectric constant (k) of dielectric films in semiconductor fabrication is continually decreasing as device scaling continues. Minimizing integration damage on low dielectric constant (low k) films is important to be able to continue decreasing feature sizes. However, as feature sizes shrink, improvement in the resistive capacitance and reliability of dielectric films becomes a serious challenge.

Current techniques for the etching or ashing of dielectric films involve process chemistries which create water ($H_2O$) as a byproduct. The water byproduct can be introduced into the deposited dielectric films, thereby increasing the k value of the dielectric film. Also, current techniques for the removal of copper oxides (CuO) and chemical mechanical planarization (CMP) residues involve the use of ammonia ($NH_3$) or hydrogen ($H_2$) plasmas. Removal of the copper oxides and CMP residues are necessary to improve the electromigration (EM) of the metallization structures and the time dependent dielectric breakdown (TDDB) of the ILD films. However, exposing low k films to $NH_3$ and $H_2$ plasmas modifies the film structure and increases the k value. Present repair techniques involve liquid phase silylation or use of supercritical $CO_2$. However, such techniques have not proven effective for repairing sidewall damage of recessed features in the films.

Thus, a method for repairing the dielectric films to lower the k value is necessary to improve efficiency and allow for smaller device sizes.

SUMMARY OF THE INVENTION

Embodiments of the present invention generally relate to methods for repairing and lowering the dielectric constant of low k films for semiconductor fabrication.

In one embodiment, a method of repairing a damaged low k dielectric film is disclosed. The method comprises alternatingly exposing a dielectric film to ultraviolet (UV) radiation and a silylation compound at least two times.

In another embodiment, a method of repairing a damaged low k dielectric film is disclosed. The method comprises exposing a dielectric film to a silylation compound, depositing a layer of silicon oxide onto the dielectric film, and exposing the dielectric film and silicon oxide layer to ultraviolet (UV) radiation.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally relate to methods for repairing and lowering the dielectric constant (k-value) of low k films for semiconductor fabrication.

Figure 1A:
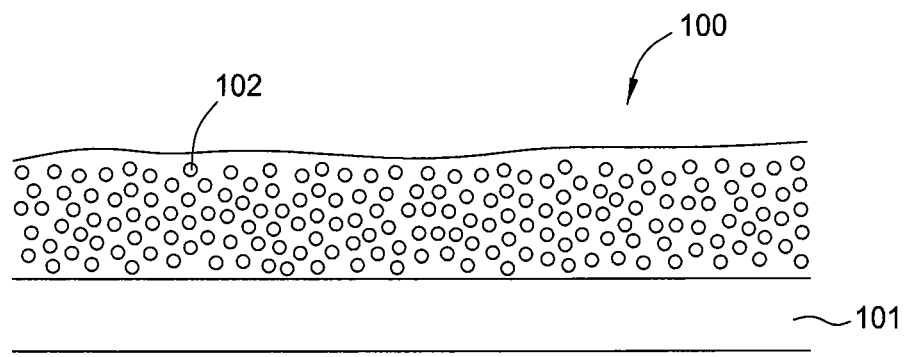
FIGS. 1A-1F illustrate a dielectric layer during various stages of processing.

FIG. 1A illustrates a dielectric film 100 deposited onto a structure 101. The structure 101 may be a substrate, such as, for example, a silicon wafer, or a previously formed layer, such as, for example, a metallization or interconnect layer. The dielectric film 100 may be a porous silicon containing low k film, such as, for example, $SiO_2$, SiOC, SiON, SiCOH, SiOCN, or other related films. The dielectric film 100 may have pores 102 formed therein.

Figure 1B:
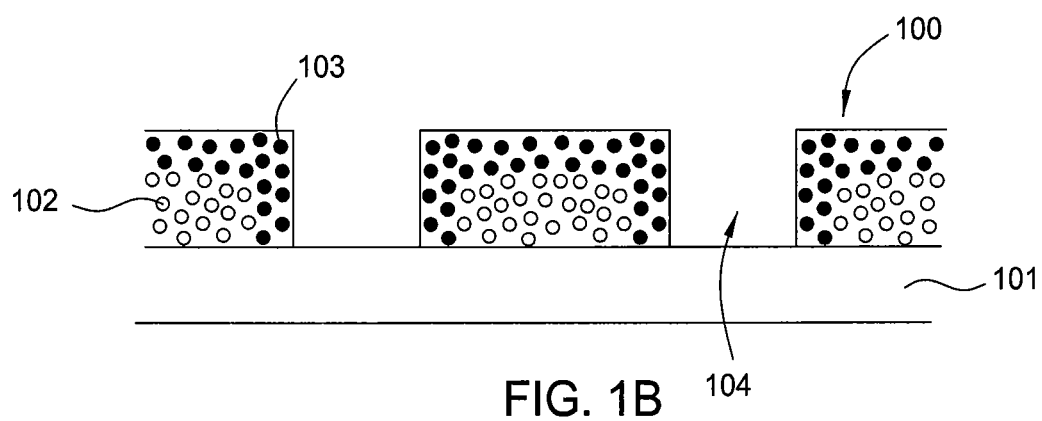

FIG. 1B illustrates the dielectric film 100 after being planarized and etched to form features 104 into the dielectric film 100. The dielectric film 100 may be planarized by a chemical mechanical planarization (CMP) process, for example. The dielectric film 100 may be etched by masking a portion of the dielectric film 100, contacting the unmasked portion of the dielectric film 100 with a plasma formed from hydrofluoric acid (HF) vapor, and ashing away the mask using a plasma formed from oxygen ($O_2$) gas or $CO_2$ gas, for example.

The planarization, ashing, and etching of the dielectric film 100 introduce hydrogen and/or water into the dielectric film 100 causing Si—OH groups to form, for example, which make the dielectric film 100 hydrophilic. The hydrophilic property of the dielectric film 100 causes the pores 102 to fill with water creating damaged pores 103. Both the Si—OH groups and damaged pores 103 increase the k-value of the dielectric film 100. The damage from the planarization and etching are usually localized to an upper portion of the dielectric film 100 and to the sidewalls of the features 104, as shown in FIG. 1B.

Figure 1C:
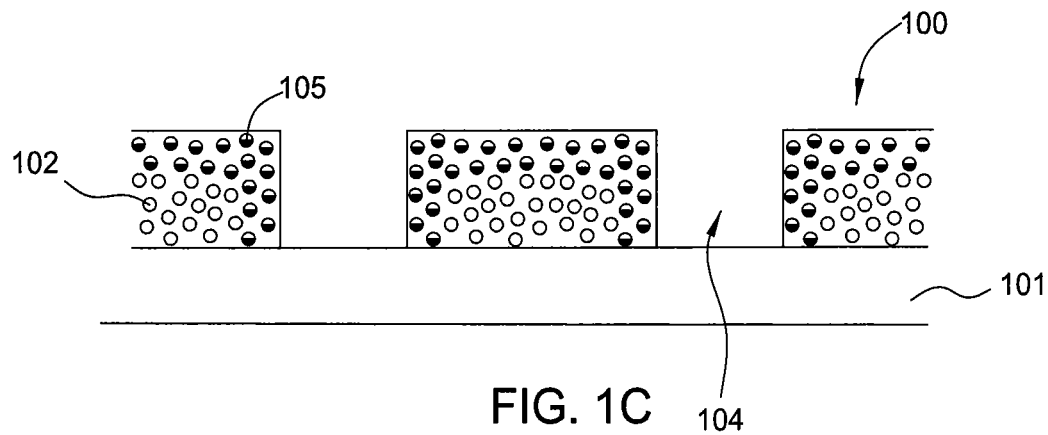

FIG. 1C illustrates the dielectric film 100 after being repaired by one or more processes which are described below. The repair processes decrease the k-value of the dielectric film 100 by removing the water from the damaged pores 103, thereby creating repaired pores 105, and by converting the Si—OH groups in the dielectric film 100 into hydrophobic Si—O—Si($CH_3$)$_3$ groups, for example. The hydrophobic Si—O—Si($CH_3$)$_3$ groups assist in driving water out of the damaged pores 103 of the dielectric film 100.

In one embodiment, the dielectric film 100 may be repaired by a vapor phase silylation process. The vapor phase silylation process comprises contacting the dielectric film 100 with a vaporized silylation compound to create the Si—O—Si($CH_3$)$_3$ groups in the dielectric film 100 described above. Vaporizing the silylation compound allows the silylation compound to penetrate deeply into the dielectric film 100. The silylation compound may be hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS) ($CH_3$—Si—($OCH_3$)$_3$), dimethyldimethoxysilane (DMDMS) (($CH_3$)$_2$—Si—($OCH_3$)$_2$), methyltrimethoxysilane (MTMS) (($CH_3$)$_3$—Si—$OCH_3$), phenyltrimethoxysilane (PTMOS) ($C_6H_5$—Si—($OCH_3$)$_3$), phenyldimethylchlorosilane (PDMCS) ($C_6H_5$—Si—($CH_3$)$_2$—Cl), dimethylaminotrimethylsilane (DMATMS) (($CH_3$)$_2$—N—Si—($CH_3$)$_3$), bis(dimethylamino)dimethylsilane (BDMADMS), or other compounds containing Si, H, and C.

The vapor phase silylation process may be conducted by placing the dielectric film 100 into a processing chamber, vaporizing the silylation compound, and flowing the vaporized silylation compound into the processing chamber. The silylation compound may alternatively be vaporized in the processing chamber. The silylation compound may be introduced into the processing chamber through a showerhead positioned at an upper portion of the processing chamber. A carrier gas, such as He, may be used to assist the flow of the silylation compound into the processing chamber. Additionally, a catalyst, such as water, may be added during the vapor phase silylation process. The vapor phase silylation process may be conducted at a processing chamber pressure between 50 mTorr and 500 Torr, such as 6 Torr, a dielectric film temperature between 100° C. and 400° C., such as 385° C., a silylation compound flow rate between 0.5 g/min and 5 g/min, such as 1 g/min, and a processing time between 1 min and 10 min, such as 3 min. The pressure within the processing chamber may be varied during the vapor phase silylation process. For example, the pressure may be varied between 50 Torr and 500 Torr.

In another embodiment, the dielectric film 100 may be repaired by an ultra-violet (UV) cure process. The UV cure process comprises contacting the dielectric film 100 with UV radiation to remove water from the damaged pores and to create the Si—O—Si(CH$_3$)$_3$ groups in the dielectric film 100 described above. The UV cure process may be conducted by placing the dielectric film 100 into a processing chamber and engaging a source of UV radiation to contact the dielectric film 100 with UV radiation. The UV radiation source may be a UV lamp, for example. The UV radiation source may be positioned outside of the processing chamber, and the processing chamber may have a quartz window through which UV radiation may pass. The dielectric film 100 may be positioned in an inert gas environment, such as He or Ar, for example. The processing chamber may also include a microwave source to heat the dielectric film 100 prior to or concurrently with contacting the dielectric film 100 with UV radiation. The UV cure process may also be conducted using a plasma to simulate UV radiation wavelengths. The plasma may be formed by coupling RF power to a treatment gas such as He, Ar, O$_2$, and N$_2$. The UV cure process may be conducted at a processing chamber pressure between 1 Torr and 100 Torr, such as 6 Torr, a dielectric film temperature between 20° C. and 400° C., such as 385° C., an environment gas flow rate between 8 slm and 24 slm, such as 16 slm, a treatment gas flow rate between 2 slm and 20 slm, such as 12 slm, a RF power between 50 W and 1000 W, such as 500 W, a RF power frequency of 13.56 MHz, a processing time between 10 sec and 180 sec, such as 60 sec, a UV irradiance power between 100 W/m$^2$ and 2000 W/m$^2$, such as 1500 W/m$^2$, and UV wavelengths between 100 nm and 400 nm. The UV cure process described above advantageously repairs the damaged pores 103 in the sidewalls of the features 104.

In another embodiment, the dielectric film 100 may be repaired using the vapor phase silylation process described above followed by the UV cure process also described above, or vice versa. The two processes may also be conducted in the same chamber. For example, the processing chamber may contain a showerhead and a quartz window, which may be integrated into a single component.

In another embodiment, the dielectric film 100 may be repaired using a process including a UV cure followed by vapor phase silylation which is then followed by an additional UV cure. The 3-phase process operates to remove water from the damaged pores 103 so that the silylation compound can penetrate and repair the damaged pores 103. The initial UV cure removes water from the surface of the dielectric film 100 and from the sidewalls of the features 104, the vapor phase silylation recovers the hydrophobicity of the film, and the additional UV cure completes the repair of the dielectric film 100. The process may be conducted in a single processing chamber or multiple processing chambers.

In another embodiment, the dielectric film 100 may be repaired by an in-situ pulsed silylation and UV cure process. The in-situ pulsed silylation and UV cure process may be conducted by placing the dielectric film 100 into a processing chamber and alternatingly contacting the dielectric film 100 with UV radiation and a silylation compound. For example, in one portion of the in-situ pulsed silylation and UV cure process, a source of UV radiation may be engaged to contact the dielectric film 100 UV radiation for between 5 seconds and 10 seconds and then disengaged. In another portion of the in-situ pulsed silylation and UV cure process, a liquid or vaporized silylation compound, such as one of the silylation compounds mentioned above, may be flowed into the processing chamber for between 5 seconds and 10 seconds to contact the dielectric film 100 and then the flow may be stopped. The two portions of the in-situ pulsed silylation and UV cure process may be repeated as needed to repair the dielectric film 100. For example, the two portions of the in-situ pulsed silylation and UV cure process may be repeated 10 times. It should be understood that either portion may begin the repair procedure and be followed by the other portion. The silylation compound may be introduced into the processing chamber through a showerhead positioned at an upper portion of the processing chamber, the UV radiation source may be a UV lamp positioned outside of the processing chamber, and the processing chamber may have a quartz window through which UV radiation may pass. The in-situ pulsed silylation and UV cure process may be conducted at a processing chamber pressure between 1 Torr and 500 Torr, such as 6 Torr, a dielectric film temperature between 100° C. and 400° C., such as 385° C., a silylation compound flow rate between 0.5 g/min and 5 g/min, such as 1 g/min, a total processing time between 10 sec and 600 sec, such as 180 sec, a UV irradiance power between 100 W/m$^2$ and 2000 W/m$^2$, such as 1500 W/m$^2$, and UV wavelengths between 100 nm and 400 nm.

In another embodiment, the dielectric film 100 may be repaired by an in-situ silylation and UV cure process. The in-situ silylation and UV cure process may be conducted by placing the dielectric film 100 into a processing chamber, continuously flowing a liquid or vaporized silylation compound, such as one of the silylation compounds mentioned above, into the processing chamber to contact the dielectric film 100, and simultaneously contacting the dielectric film 100 with pulsed UV radiation. The silylation compound may be introduced into the processing chamber through a showerhead positioned at an upper portion of the processing chamber, the UV radiation source may be a UV lamp positioned outside of the processing chamber, and the processing chamber may have a quartz window through which UV radiation may pass. The in-situ silylation and UV cure process may be conducted at a processing chamber pressure between 1 Torr and 500 Torr, such as 6 Torr, a dielectric film temperature between 100° C. and 400° C., such as 385° C., a silylation compound flow rate between 0.5 g/min and 5 g/min, such as 1 g/min, a total processing time between 10 sec and 600 sec, such as 180 sec, a UV irradiance power between 100 W/m$^2$ and 2000 W/m$^2$, such as 1500 W/m$^2$, and UV wavelengths between 100 nm and 400 nm.

In another embodiment, the dielectric film 100 may be repaired by 3-phase procedure including a silylation process, a low temperature conformal silicon oxide deposition process, and a UV cure process. The silylation and UV cure processes may be similar to those initially described above. The low temperature conformal silicon oxide deposition process is an atomic layer deposition (ALD) type process for depositing very thin layers. In the low temperature conformal silicon oxide deposition process, a conformal seed layer is deposited onto the dielectric film 100 by positioning the dielectric film 100 into a processing chamber and exposing the dielectric film 100 to a plasma formed from a silicon-containing precursor. The conformal seed layer is then treated with a plasma formed from an oxygen-containing precursor, thereby forming a silicon oxide layer on the dielectric film 100. The process may be repeated until a desired thickness of silicon oxide is formed.

Suitable silicon-containing precursors may include octamethylcyclotetrasiloxane (OMCTS), methyldiethoxysilane (MDEOS), bis(tertiary-butylamino)silane (BTBAS), tridimethylaminosilane (TriDMAS), silane, disilane, dichlorosilane, trichlorosilane, dibromosilane, silicon tetrachloride, silicon tetrabromide, or combinations thereof. The silicon-containing plasma is provided at about 50 W to about 3000 W of RF power at a frequency of 13.56 MHz and/or 350 KHz. The RF power may be provided to a showerhead, i.e., a gas distribution assembly, and/or a substrate support of the chamber. The spacing between the showerhead and the substrate support is greater than about 230 mils, such as between about 350 mils and about 800 mils.

The silicon-containing precursor may optionally include carrier gases, such as helium, nitrogen, oxygen, nitrous oxide, and argon. The silicon-containing precursor may be introduced at a flow rate of between about 5 sccm and about 1000 sccm. An optional carrier gas, e.g., helium, may be introduced at a flow rate of between about 100 sccm and about 20000 sccm. The ratio of the flow rate of the silicon-containing precursor, e.g., octamethylcyclotetrasiloxane, to the flow rate of the carrier gas, e.g., helium, is about 1:1 or greater, such as between about 1:1 and about 1:100. The processing chamber pressure may be greater than about 5 mTorr, such as between about 1.8 Torr and about 10 Torr, and the temperature of a dielectric film 100 may be between about 125° C. and about 580° C. while the silicon-containing precursor is flowed into the processing chamber to deposit the conformal seed layer. More particularly, the temperature is between about 200° C. and about 400° C.

The silicon-containing precursor may be flowed into the chamber for a period of time sufficient to deposit a layer having a thickness of between about 5 Å and about 2000 Å. For example, the silicon-containing precursor may be flowed into the chamber for between about 0.1 seconds and about 120 seconds.

Suitable oxygen-containing precursors may include oxygen ($O_2$) gas or nitrous oxide ($N_2O$). The oxygen-containing precursor may be introduced into the chamber at a flow rate of between about 100 and about 20000 sccm. The oxygen-containing precursor may be flown into the chamber for a period of time such as between about 0.1 seconds and about 120 seconds. The oxygen plasma may be provided by applying a RF power of between about 50 W and about 3000 W in the chamber at a frequency of 13.56 MHz and/ or 350 KHz. The chamber pressure may be between about 5 mTorr and about 10 Torr, and the temperature of the dielectric film 100 may be between about 125° C. and about 580° C. while the oxygen-containing precursor is flowed into the chamber. A suitable processing chamber for the carbon-containing plasma process is the PRODUCER® SNOW PECVD chamber, commercially available from Applied Materials, Inc., located in Santa Clara, Calif. The 3-phase procedure described above advantageously seals the damaged pores which may have been cracked during the etching, ashing, or planarization processes discussed above.

In another embodiment, the dielectric film 100 may be repaired by a carbon-containing plasma process. The carbon-containing plasma process may be conducted by placing the dielectric film 100 into a processing chamber, flowing a carbon-containing precursor gas, such as a hydrocarbon precursor gas, into the processing chamber, coupling RF power to the carbon-containing precursor gas to form a plasma, and contacting the dielectric film 100 with the carbon-containing plasma. The carbon-containing precursor gas may include ethylene, acetylene, butadiene, alpha-terpinene (A-TRP), methane, bicycloheptadiene (BCHD), or other related compounds. The carbon-containing precursor gas may be introduced into the processing chamber through a showerhead positioned at an upper portion of the processing chamber. A suitable processing chamber for the carbon-containing plasma process is the PRODUCER® PECVD chamber, commercially available from Applied Materials, Inc., located in Santa Clara, Calif. The carbon-containing plasma process may be conducted at a processing chamber pressure between 1 Torr and 50 Torr, such as 10 Torr, a dielectric film temperature between 20° C. and 400° C., such as 300° C., a carbon-containing precursor gas flow rate between 10 sccm and 5000 sccm, such as 1000 sccm, a RF power between 10 W and 1000 W, such as 300 W, a RF power frequency between 0.01 MHz and 300 MHz, such as 13.56 MHz, and a processing time between 5 sec and 600 sec, such as 60 sec.

Figure 1D:
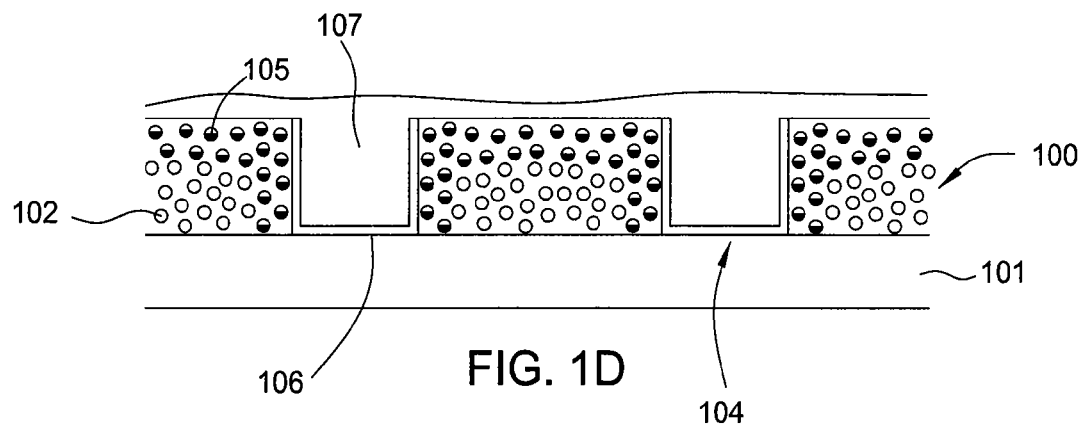
Figure 1E:
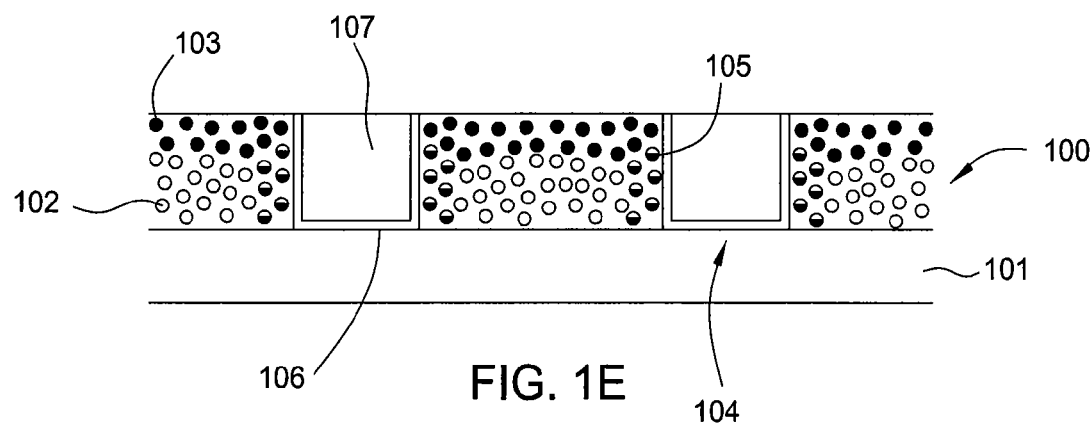
Figure 1F:
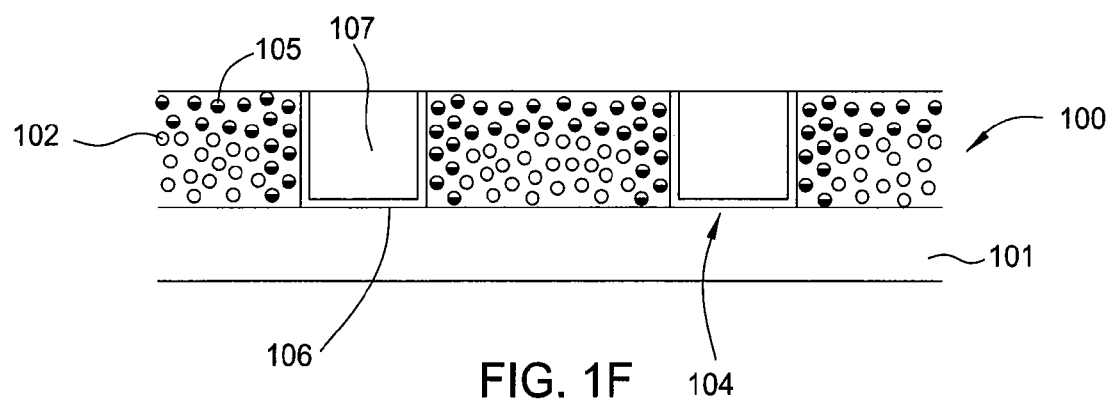

After the dielectric film 100 has been repaired, subsequent processes may be performed to continue the fabrication of the semiconductor. For example, a diffusion barrier 106 may be deposited into the features 104 of the dielectric film 100 and a metal material 107, such as, for example, copper or a copper alloy, may be deposited into the features 104, as seen in FIG. 1D. It may be necessary to planarize the metal material 107 and remove any oxides from the metal material 107 that may form during planarization. Common metal oxide removal techniques involve the use of hydrogen or ammonia plasmas. The planarization and/or metal oxide removal processes may re-damage the surface of the dielectric film 100, as seen in FIG. 1E. The dielectric film 100 may be repaired using any of the repair processes described above, as seen in FIG. 1F.

The repair processes described effectively lower the k-value of the damaged dielectric films thus enabling the continued scaling of semiconductor device features.

While the foregoing is directed to embodiments of the present invention, other and further embodiments of the invention may be devised without departing from the basic scope thereof, and the scope thereof is determined by the claims that follow.

The invention claimed is:

1. A method of repairing a damaged low k dielectric film, comprising:
    positioning a dielectric film in a processing chamber; and
    alternatingly exposing the dielectric film to ultraviolet (UV) radiation and a vapor phase of a silylation compound at least two times in the same processing chamber, wherein the dielectric film is exposed to the UV radiation for between 5 seconds and 10 seconds at a time, and the dielectric film is exposed to the vapor phase of the silylation compound for between 5 seconds and 10 seconds at a time, and wherein exposing to the vapor phase of the silylation compound recovers the hydrophobicity of the dielectric film.

2. The method of claim 1, wherein the dielectric film is exposed to the silylation compound, and simultaneously contacted with pulsed UV radiation.

3. The method of claim 1, wherein the silylation compound is flown as a liquid compound into the processing chamber and formed into the vapor phase inside the processing chamber.

4. The method of claim 1, wherein the silylation compound is flown as a vaporized compound into the processing chamber.

5. The method of claim 1, wherein exposing the dielectric film to the UV radiation comprises:
emitting UV radiation from a source of UV radiation into the processing chamber, wherein the source of the UV radiation is an UV lamp positioned outside the processing chamber, and the processing chamber includes a quartz window through which the UV radiation passes.

6. The method of claim 5, wherein exposing the dielectric film to the UV radiation comprises:
forming a plasma in the processing chamber from at least one of He, Ar, $O_2$, or $N_2$ gas to simulate UV radiation.

7. The method of claim 1, wherein exposing the dielectric film to the silylation compound comprises:
flowing the silylation compound into the processing chamber and simultaneously contacting the dielectric film with pulsed UV radiation.

8. The method of claim 1, wherein the processing chamber is at a pressure between 1 Torr and 500 Torr, the dielectric film is at a temperature between 100° C. and 400° C., the silylation compound is flown into the processing chamber at a flow rate between 0.5 g/min and 5 g/min, the dielectric film is processed for a total processing time between 10 sec and 600 sec, the dielectric film is contacted with UV radiation at a UV irradiance power between 100 W/m$^2$ and 2000 W/m$^2$ and UV wavelengths between 100 nm and 400 nm.

9. The method of claim 1, wherein the silylation compound comprises a compound containing at least Si, H, and C, which is flown into the processing chamber through a showerhead positioned at an upper portion of the processing chamber.

10. The method of claim 1, wherein the silylation compound comprises hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS) (CH$_3$—Si—(OCH$_3$)$_3$), dimethyldimethoxysilane (DMDMS) ((CH$_3$)$_2$—Si—(OCH$_3$)$_2$), methyltrimethoxysilane (MTMS) ((CH$_3$)$_3$—Si—OCH$_3$), phenyltrimethoxysilane (PTMOS) (C$_6$H$_5$—Si—(OCH$_3$)$_3$), phenyldimethylchlorosilane (PDMCS) (C$_6$H$_5$—Si—(CH$_3$)$_2$—Cl), dimethylaminotrimethylsilane (DMATMS) ((CH$_3$)$_2$—N—Si—(CH$_3$)$_3$), or bis(dimethylamino)dimethylsilane (BDMADMS).

11. A method of repairing a damaged low k dielectric film, comprising:
exposing a dielectric film to a silylation compound;
depositing a conformal seed layer of silicon oxide onto the dielectric film, wherein the depositing the conformal seed layer of silicon oxide onto the dielectric film comprises forming a plasma from a silicon-containing precursor to deposit a silicon-containing compound onto the dielectric film, and exposing the deposited silicon-containing compound to an oxygen-containing plasma; and
exposing the dielectric film and the conformal seed layer of silicon oxide to ultraviolet (UV) radiation.

12. The method of claim 11, wherein the silicon-containing precursor comprises octamethylcyclotetrasiloxane (OMCTS), methyldiethoxysilane (MDEOS), bis(tertiary-butylamino)silane (BTBAS), tridimethylaminosilane (TriDMAS), silane, disilane, dichlorosilane, trichlorosilane, dibromosilane, silicon tetrachloride, or silicon tetrabromide.

13. The method of claim 11, wherein exposing the deposited silicon-containing compound to the oxygen-containing plasma comprises forming a plasma from an oxygen-containing precursor comprising $O_2$ or $N_2O$.

14. The method of claim 11, wherein the silylation compound is flown into the processing chamber as a vaporized compound in a vapor phase.

15. The method of claim 11, further comprising positioning the dielectric film in a processing chamber, wherein exposing the dielectric film to the silylation compound and exposing the dielectric film and the conformal seed layer of silicon oxide to the UV radiation are performed in the same processing chamber.

16. The method of claim 11, wherein exposing the dielectric film to the UV radiation comprises:
emitting UV radiation from a source of UV radiation into the processing chamber, wherein the source of the UV radiation is an UV lamp positioned outside the processing chamber, and the processing chamber includes a quartz window through which the UV radiation passes.

17. The method of claim 16, wherein exposing the dielectric film to the UV radiation comprises:
forming a plasma in the processing chamber from at least one of He, Ar, $O_2$, or $N_2$ gas to simulate UV radiation.

18. The method of claim 11, wherein exposing the dielectric film to the silylation compound comprises:
flowing the silylation compound into the processing chamber through a showerhead positioned at an upper portion of the processing chamber.

19. The method of claim 11, wherein the silylation compound comprises hexamethyldisilazane (HMDS), tetramethyldisilazane (TMDS), trimethylchlorosilane (TMCS), dimethyldichlorosilane (DMDCS), methyltrichlorosilane (MTCS), trimethylmethoxysilane (TMMS) (CH$_3$—Si—(OCH$_3$)$_3$), dimethyldimethoxysilane (DMDMS) ((CH$_3$)$_2$—Si—(OCH$_3$)$_2$), methyltrimethoxysilane (MTMS) ((CH$_3$)$_3$—Si—OCH$_3$), phenyltrimethoxysilane (PTMOS) (C$_6$H$_5$—Si—(OCH$_3$)$_3$), phenyldimethylchlorosilane (PDMCS) (C$_6$H$_5$—Si—(CH$_3$)$_2$—Cl), dimethylaminotrimethylsilane (DMATMS) ((CH$_3$)$_2$—N—Si—(CH$_3$)$_3$), or bis(dimethylamino)dimethylsilane (BDMADMS).

20. The method of claim 14, wherein the silylation compound is flown as a liquid compound into the processing chamber and vaporized into a vapor phase inside the processing chamber.

* * * * *